US009461159B1

(12) United States Patent
Chou et al.

(10) Patent No.: US 9,461,159 B1
(45) Date of Patent: Oct. 4, 2016

(54) SELF-STOP GATE RECESS ETCHING PROCESS FOR SEMICONDUCTOR FIELD EFFECT TRANSISTORS

(71) Applicant: NORTHROP GRUMMAN SYSTEMS CORPORATION, Falls Church, VA (US)

(72) Inventors: Yeong-Chang Chou, Irvine, CA (US); Sujane C. Wang, Rolling Hills Estates, CA (US); Hsu-Hwei Chen, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/996,026

(22) Filed: Jan. 14, 2016

(51) Int. Cl.
| | | |
|---|---|---|
| *H01L 21/335* | (2006.01) | |
| *H01L 21/338* | (2006.01) | |
| *H01L 21/336* | (2006.01) | |
| *H01L 29/778* | (2006.01) | |
| *H01L 29/205* | (2006.01) | |
| *H01L 29/66* | (2006.01) | |
| *H01L 21/306* | (2006.01) | |

(Continued)

(52) U.S. Cl.
CPC ..... *H01L 29/7784* (2013.01); *H01L 21/02057* (2013.01); *H01L 21/308* (2013.01); *H01L 21/30608* (2013.01); *H01L 29/205* (2013.01); *H01L 29/66462* (2013.01)

(58) Field of Classification Search
CPC .............. H01L 29/772; H01L 29/7783; H01L 29/7787; H01L 29/66431; H01L 29/66462; H01L 29/4236; H01L 29/7371; H01L 21/02538; H01L 21/28575

USPC ............... 257/192, 197, 200, 213, 220, 565; 438/142, 156, 167, 172, 173, 182, 212, 438/235, 268, 272
See application file for complete search history.

(56) References Cited

U.S. PATENT DOCUMENTS

| | | |
|---|---|---|
| 5,362,677 A | 11/1994 | Sakamoto et al. |
| 5,364,816 A | 11/1994 | Boos et al. |

(Continued)

FOREIGN PATENT DOCUMENTS

| | | |
|---|---|---|
| JP | H06-84956 A | 3/1994 |

OTHER PUBLICATIONS

Chang, E. Y. et al. "A GaAs/AlAs Wet Selective Etch Process for the Gate Recess of GaAs Power Metal-Semiconductor Field-Effect Transistors" Journal of the Electrochemical Society, 148 (1), 2001, pp. G4-G9.

(Continued)

*Primary Examiner* — Hsien Ming Lee
(74) *Attorney, Agent, or Firm* — John A. Miller; Miller IP Group, PLC

(57) ABSTRACT

A field effect transistor (FET) device including a GaAs substrate, an AlGaAs buffer layer provided on the substrate, an InGaAs channel layer provided on the buffer layer, an AlGaAs barrier layer provided on the channel layer, a GaAs undoped etch stop layer provided on the barrier layer where the undoped layer defines a depth of a gate recess in the FET device, and a heavily doped GaAs cap layer provided on the etch stop layer. The cap layer has a predetermined thickness and the thickness of the combination of the barrier layer and the undoped layer has the predetermined thickness, where the thickness of the undoped layer and the thickness of the barrier layer are selectively provided relative to each other so as to define the depth of the gate recess.

13 Claims, 3 Drawing Sheets

(51) Int. Cl.
*H01L 21/308* (2006.01)
*H01L 21/02* (2006.01)

(56) References Cited

U.S. PATENT DOCUMENTS

| | | | |
|---|---|---|---|
| 5,436,201 A | 7/1995 | Chi et al. | |
| 5,556,797 A | 9/1996 | Chi et al. | |
| 5,643,807 A | 7/1997 | Frijlink et al. | |
| 5,770,525 A | 6/1998 | Kamiyama | |
| 6,060,402 A | 5/2000 | Hanson | |
| 6,087,207 A | 7/2000 | Tong | |
| 6,248,666 B1 | 6/2001 | Frijlink et al. | |
| 6,307,221 B1 | 10/2001 | Danzilio | |
| 6,797,994 B1 | 9/2004 | Hoke et al. | |
| 6,838,325 B2 | 1/2005 | Whelan et al. | |
| 7,199,014 B2 | 4/2007 | Anda | |
| 2003/0080348 A1* | 5/2003 | Inai | H01L 29/7783 257/192 |
| 2006/0043416 A1* | 3/2006 | P. Li | H01L 21/28593 257/192 |
| 2015/0123171 A1* | 5/2015 | Radosavljevic | H01L 21/2256 257/194 |
| 2015/0243773 A1* | 8/2015 | Basu | H01L 29/205 257/194 |
| 2016/0049502 A1* | 2/2016 | Chin | H01L 29/7371 257/22 |

OTHER PUBLICATIONS

Alavi, K. et al. "A Very High Performance, High Yield, and High Throughput Millimeter Wave Power pHEMT Process Technology" GaAs Mantech, Inc. 2001, 3 pgs.

Grundbacher, Ronald et al. "Utilization of an Electron Beam Resist Process to Examine the Effects of Asymmetric Gate Recess on the Device Characteristics of AlGaAs/InGaAs PHEMT's" IEEE Transactions on Electron Devices, vol. 44, No. 12, Dec. 1997, pp. 2136-2142.

* cited by examiner

SELF-STOP GATE RECESS ETCHING PROCESS FOR SEMICONDUCTOR FIELD EFFECT TRANSISTORS

BACKGROUND

1. Field

This invention relates generally to a field effect transistor (FET) device including an etch stop layer that defines the etch depth of a gate terminal recess and, more particularly, to an FET device including an etch stop layer that defines the etch depth of a gate terminal recess, where the etch stop layer is an undoped GaAs layer deposited on an AlGaAs barrier layer.

2. Discussion

Field effect transistors (FET) are well known in the transistor art, come in a variety of types, such a HEMT, MOSFET, MISFET, FinFET, etc., and can be integrated as horizontal devices or vertical devices. A typical FET will include various semiconductor layers, such as silicon, gallium arsenide (GaAs), indium gallium arsenide (InGaAs), indium aluminum arsenide (InAlAs), gallium nitride (GaN), indium phosphide (InP), etc. Sometimes the semiconductor layers are doped with various impurities, such as boron or silicon, to increase the population of carriers in the layer, where the higher the doping level of the layer the greater the conductivity of the particular semiconductor material. An FET will also include a source terminal, a drain terminal and a gate terminal, where one or more of the semiconductor layers is a channel layer and is in electrical contact with the source and drain terminals. An electrical potential provided to the source terminal allows electrical carriers, either N-type or P-type, to flow through the channel layer to the drain terminal. An electric signal applied to the gate terminal creates an electrical field that modulates the carriers in the channel layer, where a small change in the gate voltage can cause a large variation in the population of carriers in the channel layer to change the current flow from the source terminal to the drain terminal.

Integrated circuits are typically fabricated by epitaxial fabrication processes that deposit or grow the various semiconductor layers on a semiconductor substrate to provide the circuit components of the device. Substrates for integrated circuits include various semiconductor materials, such as silicon, InP, GaAs, SiC, etc. As integrated circuit fabrication techniques advance and become more complex, more circuit components are able to be fabricated on the substrate within the same area and be more closely spaced together. Further, these integrated circuit fabrication techniques allow the operating frequencies of the circuit to increase to very high frequencies, well into the GHz range.

In a typical FET device, the source terminal and the drain terminal are usually fabricated on a heavily doped cap layer to provide a better conductive path to the channel layer. For certain FET devices, higher performance can be achieved by forming a recess through the cap layer and fabricating the gate terminal in the recess so that it is closer to the channel layer. By placing the gate terminal closer to the channel layer, the transconductance Gm of the device is improved by providing more effective control of the charge in the channel layer, which provides faster switching times.

A typical GaAs FET device includes a heterojunction structure defined by an N+ GaAs cap layer provided on an AlGaAs Schottkey barrier layer. A gate recess is formed by first depositing a photoresist layer over the cap layer for all of the devices on the wafer that is patterned to define an opening therein through which the gate recess can be etched into the heterojunction structure. A typical gate recess etching process for this type of device generally requires a two-step etching process using two chemical etching solutions, for example, a first etch solution including hydrochloric acid (HCL) and deionized water (DI) and a second etch solution including ammonia ($NH_4OH$) and hydrogen peroxide ($H_2O_2$). In one specific example, the two-step etching process includes an initial HCL:DI oxide etch, a deionized water rinse without drying, an initial $NH_4OH$:$H_2O_2$:DI etch, and then another deionized water. This two-step etching process is repeated over 10-16 cycles to reach the desired depth of the gate recess into the AlGaAs barrier layer.

The gate recess etching process discussed above has a number of drawbacks. For example, the number of two-step etching cycles required makes the process labor intensive and more costly. Further, because of the limitations of the process, the depth of the gate recess etch for a particular FET device on the wafer may not be optimal, and may be different than other gate recess etches of other FET devices on the same wafer, which affects device non-uniformity and performance.

DETAILED DESCRIPTION OF THE EMBODIMENTS

The following discussion of the embodiments of the invention directed to a homojunction structure for a GaAs FET device including an etch stop layer to provide a self-stop gate recess etch is merely exemplary in nature, and is in no way intended to limit the invention or its applications or uses.

Figure 1:
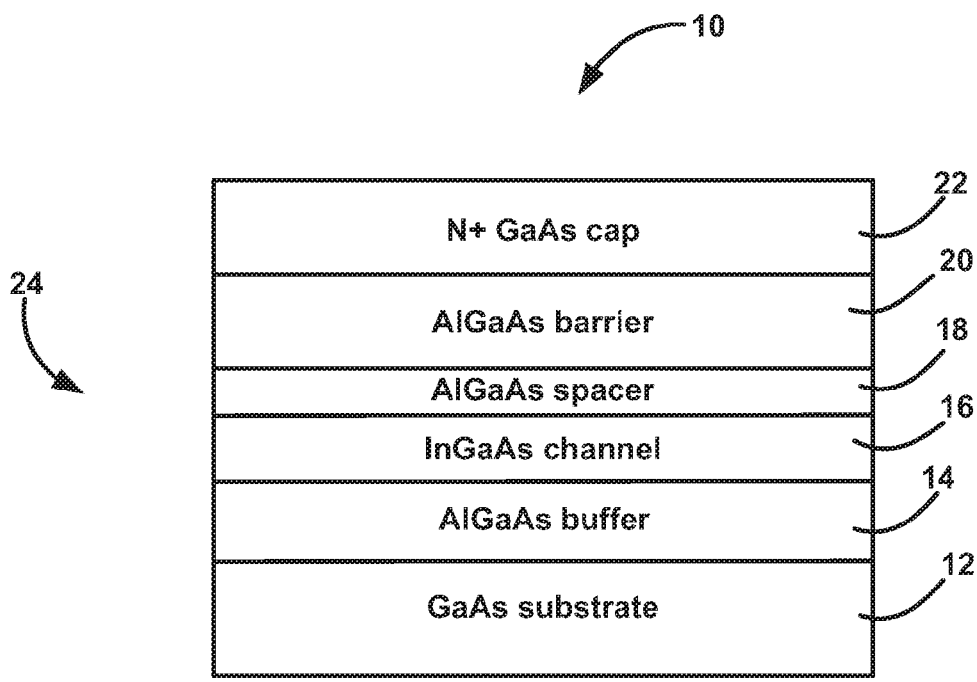
FIG. 1 is a profile view of a portion of a known GaAs FET device including a heterojunction structure.

FIG. 1 is a profile view of a portion of a known GaAs FET device 10 including a GaAs substrate 12, where the FET device 10 would be one of several FET devices fabricated on a common wafer 24 during the fabrication process. The fabrication process includes depositing an AlGaAs buffer layer 14 on the substrate 12 and depositing an InGaAs channel layer 16 on the buffer layer 14. An AlGaAs spacer layer 18 is deposited on the channel layer 16 and an AlGaAs barrier layer 20 is deposited on the spacer layer 18. A heavily doped N+GaAs cap layer 22 is deposited on the barrier layer 20 and provides electrical contact for source and drain terminals (not shown in FIG. 1). In one embodiment, the barrier layer 20 and the cap layer 22 combine to form a heterojunction structure.

Figure 2:
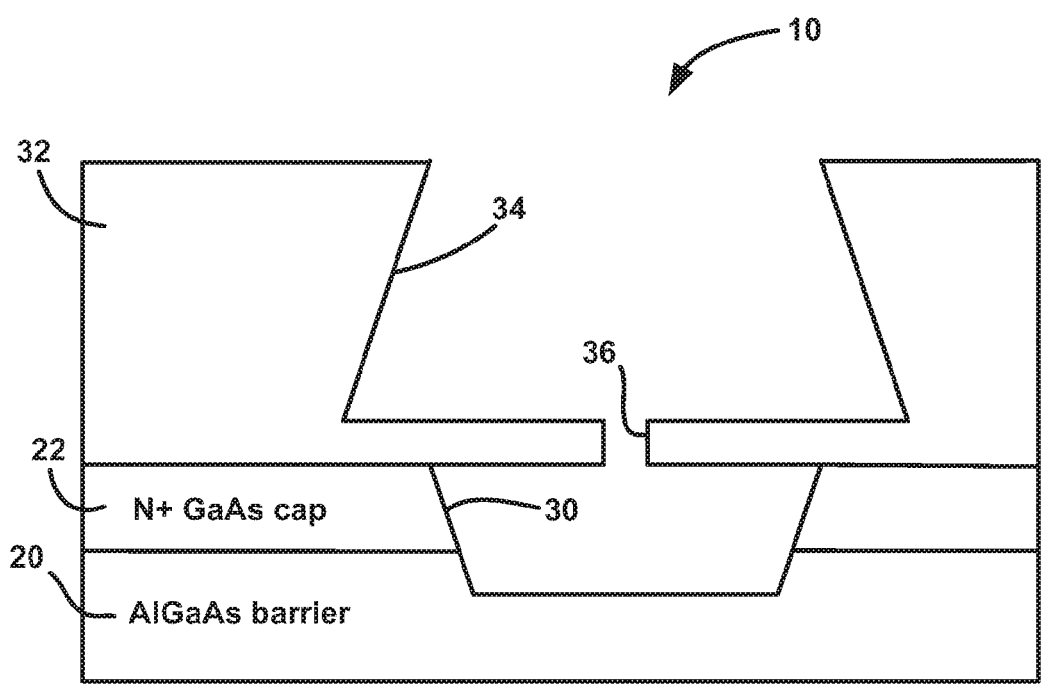
FIG. 2 is a profile view of the heterojunction structure shown in FIG. 1 and showing a gate recess formed in a barrier layer of the structure.

As discussed above, it is desirable to provide a gate terminal (not shown in FIG. 1) close to the channel layer 16. To do this, it is known to provide a gate recess through the cap layer 22 and into the barrier layer 20 in which the gate terminal is deposited. FIG. 2 is a profile view of a portion of the FET 10 showing a gate recess 30 of this type. In order to define the gate recess 30, an electron beam lithography (EBL) photoresist layer 32 is deposited on the wafer 24 to a certain thickness, where the photoresist layer 32 can be any suitable resist, such as PMMA, well known to those skilled in the art. Once the photoresist layer 32 is deposited, an electron beam lithography process is performed to provide a wide upper opening 34 and a narrow lower opening 36 in the layer 32 that will ultimately define a T-shape gate terminal. An electron beam is directed onto the wafer 24, and then the wafer 24 is immersed in a chemical solution to remove material in the photoresist layer 32 to form the openings 34 and 36.

Once the openings 34 and 36 are formed through the photoresist layer 32 a two-step etching cycling is performed of the type discussed above using the two chemical solutions HCL:DI and $NH_4OH:H_2O_2$:DI to form the gate recess 30 through the cap layer 22 and into the barrier layer 20, as shown. It is noted that the etching process undercuts the photoresist layer 32. A voltage potential applied to the source and drain terminals can be used to monitor the etching process to control the depth and size of the recess 30. However, as discussed above, multiple two-solution etching cycles are required to achieve the desired etch depth into the barrier layer 20 for the FET devices on the wafer 24, and thus the etch depth for separate FET devices is not uniform, where different FET devices on the same wafer may have different performances.

Figure 3:
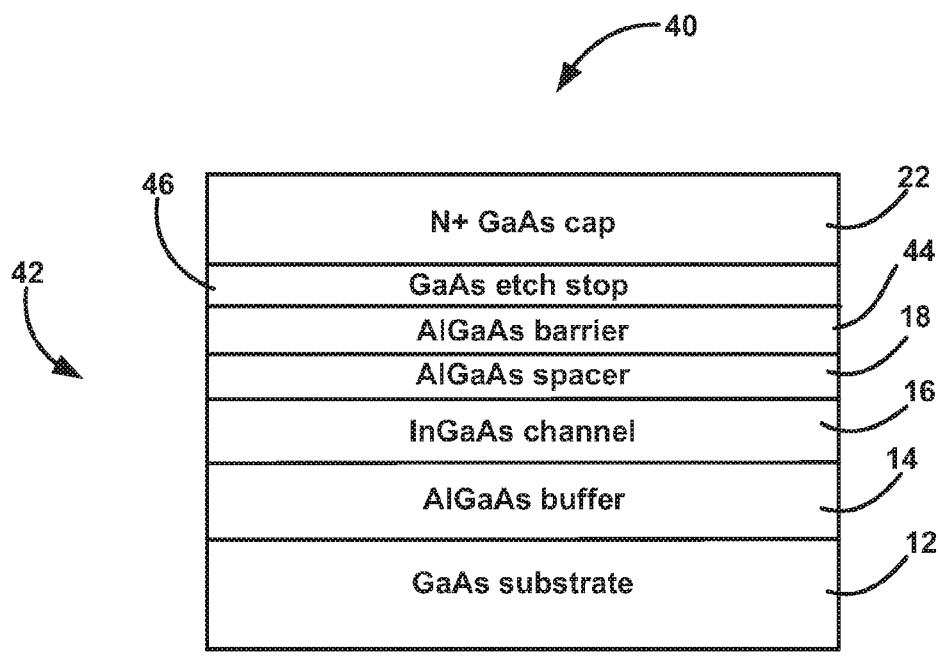
FIG. 3 is a profile view of a portion of a GaAs FET device including a homojunction structure.

The present invention proposes a technique for providing uniformity of the depth of the gate recess for all of the FET devices across the wafer using a single two-solution etching process. FIG. 3 is a profile view of an FET device 40 provided on a wafer 42 similar to the FET device 10, where like elements are identified by the same reference number. In this embodiment, the barrier layer 20 is replaced with an AlGaAs barrier layer 44 and an undoped GaAs etch stop layer 46 provided between the barrier layer 44 and the cap layer 22, where the combination of the cap layer 22 and the etch stop layer 46 define a homojunction structure. The thickness of the combination of the barrier layer 44 and the etch stop layer 46 is selected to be the same as the thickness of the barrier layer 20 so that the characteristics of the FET device 40 to that of the FET device 10 does not change.

Figure 4:
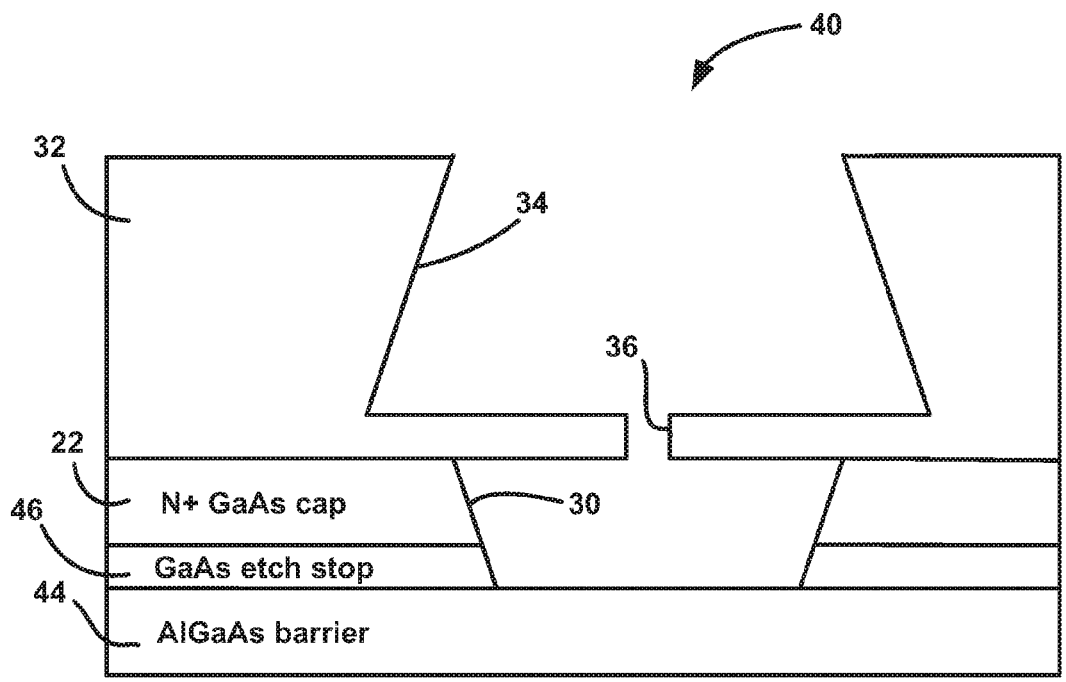
FIG. 4 is a profile view of the homojunction structure shown in FIG. 3 including an undoped etch stop layer and a gate recess.

FIG. 4 is a profile view of the FET device 40, where like elements to FIG. 2 are shown by the same reference number. In this embodiment, the same chemicals are used in the gate recess etching process, specifically the HCL:DI chemical solution etch and the $NH_4OH:H_2O_2$:DI chemical solution etch. However, only a single cycle of the two chemical etches is performed, where the etching process automatically stops at a transition between the etch stop layer 46 and the barrier layer 44 because there is a high etching selectivity between GaAs and AlGaAs materials. The etching solutions are selectively provided so that once the etch reaches the AlGaAs barrier layer 44 the etch rate into the layer 44 is very small so that only a minimal amount of the barrier layer 44 is removed. In the known etching process discussed above, the multiple etching cycles allowed the gate recess etch to go into the AlGaAs barrier layer 20.

The thickness of the layers 44 and 46 is selectively provided to provide the desired depth of the gate recess 30, where the undoped etch stop layer 46 is made thicker and the barrier layer 44 is made thinner for a deeper recess, and where the thickness of the combination of the layers 44 and 46 is the same regardless of the thickness of the individual undoped layer 46 or the barrier layer 44.

Figure 5:
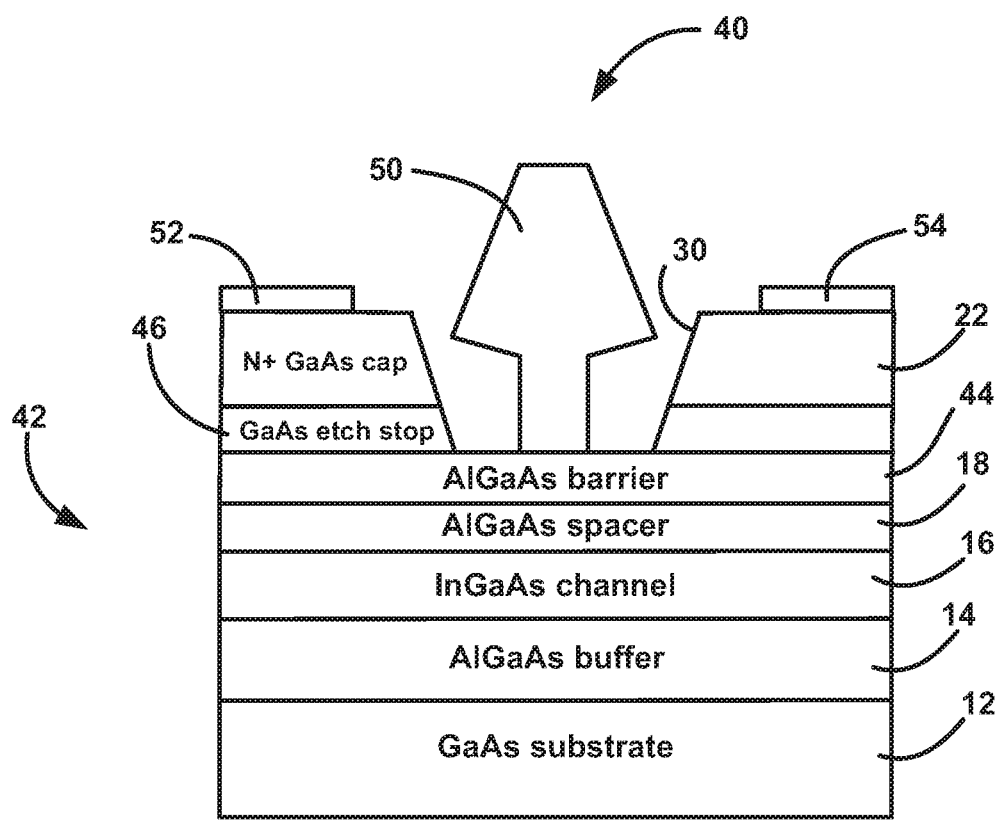
FIG. 5 is a profile view of the GaAs FET device shown in FIG. 3, and including a gate terminal, a source terminal and a drain terminal.

FIG. 5 is profile view of the FET device 40 after the gate recess 30 has been formed and the photoresist layer 32 has been removed. Also a gate terminal 50 has been formed in the recess 30, and a source terminal 52 and a drain terminal 54 have been formed on the cap layer 22 by known fabrication techniques.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for fabricating a field effect transistor (FET) device on a common wafer with other FET devices, said method comprising:
   providing a plurality of semiconductor layers including a substrate, a buffer layer deposited on the substrate, a channel layer deposited on the buffer layer, a barrier layer deposited on the channel layer, an undoped etch stop layer deposited on the barrier layer, and a heavily doped cap layer deposited on the undoped etch stop layer;
   depositing an electron-beam lithography (EBL) photoresist layer on the semiconductor wafer;
   patterning the EBL photoresist layer using an electron-beam lithography process to form a wide an upper opening in the EBL photoresist layer and a narrow lower opening in the EBL photoresist layer where the upper opening is wider than the lower opening;
   performing a first etch in a first chemical solution through the upper and lower openings in the EBL photoresist layer and into the wafer for a predetermined period of time; and
   performing a second etch in a second chemical solution through the upper and lower openings in the EBL photoresist layer for a predetermined period of time to form a gate recess to a depth defined by a transition between the undoped etch stop layer and the barrier layer.

2. The method according to claim 1 wherein the first chemical solution is HCL:DI and the second chemical solution is $NH_4OH:H_2O_2$:DI.

3. The method according to claim 1 further comprising rinsing the wafer in deionized water between the first and second etches and after the second etch.

4. The method according to claim 1 wherein providing a plurality of semiconductor layers includes providing a GaAs substrate, an AlGaAs buffer layer, an InGaAs channel layer, an AlGaAs barrier layer, a GaAs etch stop layer and a GaAs cap layer.

5. The method according to claim 1 wherein providing a plurality of semiconductor layers includes providing the heavily doped cap layer to have a predetermined thickness and providing the barrier layer and the undoped etch stop layer to have a combined thickness the same as the predetermined thickness.

6. The method according to claim 5 wherein providing a plurality of semiconductor layers includes selectively defining a thickness of the undoped etch stop layer and a thickness of the barrier layer so as to define the depth of the gate recess.

7. A method for fabricating a field effect transistor (FET) device on a common wafer with other FET devices, said method comprising:
   providing a plurality of semiconductor layers including a substrate, a buffer layer deposited on the substrate, a channel layer deposited on the buffer layer, a barrier layer deposited on the channel layer, an undoped etch stop layer deposited on the barrier layer, and a heavily doped cap layer deposited on the undoped etch stop layer;

depositing an electron-beam lithography (EBL) photoresist layer on the semiconductor wafer;

patterning the EBL photoresist layer using an electron-beam lithography process to form an upper opening in the EBL photoresist layer and a lower opening in the EBL photoresist layer where the upper opening is wider than the lower opening;

performing a first etch in an HCLDI chemical solution through the upper and lower openings in the EBL photoresist layer and into the wafer;

performing a second etch in an NH40H:H202:DI chemical solution through the upper and lower openings in the EBL photoresist layer to form a gate recess to a depth defined by a transition between the etch stop layer and the barrier layer; and rinsing the wafer in deionized water between the first and second etches and after the second etch.

8. The method according to claim 7 wherein providing a plurality of semiconductor layers includes providing a GaAs substrate, an AlGaAs buffer layer, an InGaAs channel layer, an AlGaAs barrier layer, a GaAs etch stop layer and a GaAs cap layer.

9. The method according to claim 7 wherein providing a plurality of semiconductor layers includes providing the heavily doped cap layer to have a thickness and providing the barrier layer and the undoped etch stop layer to have a combined thickness the same as the thickness.

10. The method according to claim 9 wherein providing a plurality of semiconductor layers includes selectively defining a thickness of the undoped etch stop layer and a thickness of the barrier layer so as to define the depth of the gate recess.

11. A method for fabricating a field effect transistor (FET) device on a common wafer with other FET devices, said method comprising:

providing a plurality of semiconductor layers including a GaAs substrate, an AlGaAs buffer layer deposited on the substrate, an InGaAs channel layer deposited on the buffer layer, an AlGaAs barrier layer deposited on the InGaAs channel layer, an undoped GaAs etch stop layer deposited on the barrier layer, and a heavily doped GaAs cap layer deposited on the undoped GaAs etch stop layer, wherein providing a plurality of semiconductor layers includes providing the heavily doped GaAs cap layer to have a thickness and providing the barrier layer and the undoped GaAs etch stop layer to have a combined thickness the same as the thickness;

depositing an electron-beam lithography (EBL) photoresist layer on the semiconductor wafer;

patterning the EBL photoresist layer using an electron-beam lithography process to form an upper opening in the EBL photoresist layer and a lower opening in the EBL photoresist layer where the upper opening is wider than the lower opening;

performing a first etch in a first chemical solution through the upper and lower openings in the EBL photoresist layer and into the wafer; and performing a second etch in a second chemical solution through the upper and lower openings in the EBL photoresist layer to form a gate recess to a depth defined by a transition between the undoped GaAs etch stop layer and the AlGaAs barrier layer, wherein providing a plurality of semiconductor layers includes selectively defining a thickness of the undoped etch stop layer and a thickness of the AlGaAs barrier layer so as to define the depth of the gate recess.

12. The method according to claim 11 wherein the first chemical solution is HCL:DI and the second chemical solution is $NH_4OH:H_2O_2:DI$.

13. The method according to claim 11 further comprising rinsing the wafer in deionized water between the first and second etches and after the second etch.

* * * * *